United States Patent
Tian et al.

(10) Patent No.: US 10,422,491 B2
(45) Date of Patent: Sep. 24, 2019

(54) SMALL SIZE SIDE-EMITTING LED LIGHTING STRIP

(71) Applicant: GM Global Technology Operations LLC, Detroit, MI (US)

(72) Inventors: Xue Tian, Shanghai (CN); Houli Chen, Shanghai (CN)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 0 days.

(21) Appl. No.: 15/655,011

(22) Filed: Jul. 20, 2017

(65) Prior Publication Data

US 2019/0024857 A1     Jan. 24, 2019

(51) Int. Cl.
| | |
|---|---|
| *F21V 3/00* | (2015.01) |
| *F21V 5/00* | (2018.01) |
| *F21S 4/22* | (2016.01) |
| *H05K 1/02* | (2006.01) |
| *H05K 1/03* | (2006.01) |
| *F21V 7/00* | (2006.01) |
| *H05K 1/18* | (2006.01) |
| *F21V 23/00* | (2015.01) |
| *F21Y 115/10* | (2016.01) |

(52) U.S. Cl.
CPC ............. *F21S 4/22* (2016.01); *F21V 7/0008* (2013.01); *H05K 1/028* (2013.01); *H05K 1/0393* (2013.01); *H05K 1/189* (2013.01); *F21V 23/005* (2013.01); *F21Y 2115/10* (2016.08); *H05K 2201/10106* (2013.01)

(58) Field of Classification Search
CPC ........ F21S 4/00; F21S 4/20; F21S 4/22; F21S 4/28; F21V 23/004; F21V 23/005; H05K 1/028; H05K 1/0393

USPC .............. 362/249.02, 311.02, 545, 800
See application file for complete search history.

(56) References Cited

U.S. PATENT DOCUMENTS

| | | | | |
|---|---|---|---|---|
| 7,674,009 | B2 * | 3/2010 | Chang | ............. F21K 9/00 362/249.02 |
| 7,736,044 | B2 * | 6/2010 | Chew | ............. F21V 31/04 362/612 |
| 2012/0113644 | A1 | 5/2012 | Bruyneel et al. | |
| 2015/0023054 | A1 | 1/2015 | Goda et al. | |

FOREIGN PATENT DOCUMENTS

CA        2731820 C        8/2013

OTHER PUBLICATIONS

Office Action dated May 27, 2019 from German Patent Office for German Patent Application No. 102018117536.1; 9 pages.

\* cited by examiner

*Primary Examiner* — Jason M Han

(57) ABSTRACT

A light emitting diode device is disclosed. The light emitting diode device includes a flexible printed circuit board having at least one light emitting diode mounted thereon. The at least one light emitting diode includes an emitting portion configured to emit light. The light emitting diode device also includes an encapsulation structure disposed over the flexible printed circuit board having a reflective side and a light emission side opposite of the reflective side. The light emitting diode also includes a reflective portion disposed over the reflective side of the encapsulation structure, and the emitting portion of the light emitting diode is oriented to emit light towards the reflective side.

10 Claims, 11 Drawing Sheets

SMALL SIZE SIDE-EMITTING LED LIGHTING STRIP

INTRODUCTION

The information provided in this section is for the purpose of generally presenting the context of the disclosure. Work of the presently named inventors, to the extent it is described in this section, as well as aspects of the description that may not otherwise qualify as prior art at the time of filing, are neither expressly nor impliedly admitted as prior art against the present disclosure.

The present disclosure relates to a flexible light emitting diode (LED) lighting strip, and more particularly to a flexible LED lighting strip including side-emitting light emitting diodes.

Light strips, such as flexible LED strips, are used in various applications such, but not limited to, cabinet lighting, television back lighting, staircase lighting, architectural lighting, bar lighting, kitchen lighting, vehicle accessory lighting, and the like. The flexible LED light strips typically include an elongated flexible strip of printed circuit board having conductive traces disposed thereon that provide electrical power to the LEDs. The flexible LED light strips are arranged in a desired configuration and connected to a power source to provide an illuminated environment.

SUMMARY

In an example, a light emitting diode device is disclosed. The light emitting diode device includes a flexible printed circuit board having at least one light emitting diode mounted thereon. The at least one light emitting diode includes an emitting portion configured to emit light. The light emitting diode device also includes an encapsulation structure disposed over the flexible printed circuit board having a reflective side and a light emission side opposite of the reflective side. The light emitting diode also includes a reflective portion disposed over the reflective side of the encapsulation structure, and the emitting portion of the light emitting diode is oriented to emit light towards the reflective side.

In other features, the reflective portion comprises a reflective structure integral with the encapsulation structure. In other features, the encapsulation structure and the reflective structure include a polymer material. In other features, the reflective structure comprises a maximum thickness of one-half (0.5) of a millimeter. In other features, the polymer material includes a hardness property ranging from forty (40) Shore durometers to seventy-five (75) Shore durometers. In other features, the polymer material includes a coefficient of thermal expansion (CTE) ranging from one hundred and seventy (170) in/in C.° to one hundred and eighty (180) in/in C.°.

In other features, the reflective portion includes a reflective material applied to the encapsulation structure. In other features, the reflective material comprises at least one of a white reflective film and a white reflective paint. In other features, the reflective material comprises a thickness ranging from one-tenth (0.1) of a millimeter to one-half (0.5) of a millimeter. In other features, the emitting portion is oriented along an axis parallel to a plane defined by a top surface of the flexible printed circuit board, wherein the axis is perpendicular to a plane defined by a top surface of the reflective side.

In an example, a light emitting diode device is disclosed. The light emitting diode device includes a flexible printed circuit board having at least one light emitting diode mounted thereon. The at least one light emitting diode includes an emitting portion configured to emit light. The light emitting diode device also includes an encapsulation structure disposed over the flexible printed circuit board having a reflective side and a light emission side opposite of the reflective side. The light emitting diode also includes a reflective portion disposed over the reflective side of the encapsulation structure, and the emitting portion of the light emitting diode is oriented to emit light towards the reflective side.

In other features, the reflective portion comprises a reflective structure integral with the encapsulation structure. In other features, the encapsulation structure and the reflective structure include a polymer material. In other features, the reflective structure comprises a maximum thickness of one-half (0.5) of a millimeter. In other features, the polymer material includes a hardness property ranging from forty (40) Shore durometers to seventy-five (75) Shore durometers. In other features, the polymer material includes a coefficient of thermal expansion (CTE) ranging from one hundred and seventy (170) in/in C.° to one hundred and eighty (180) in/in C.°.

In other features, the reflective portion includes a reflective material applied to the encapsulation structure. In other features, the reflective material comprises at least one of a white reflective film and a white reflective paint. In other features, the reflective material comprises a thickness ranging from one-tenth (0.1) of a millimeter to one-half (0.5) of a millimeter. In other features, the emitting portion is oriented along an axis parallel to a plane defined by a top surface of the flexible printed circuit board, and the axis is perpendicular to a plane defined by a top surface of the reflective side.

In an example, a light emitting diode device is disclosed. The light emitting diode device includes flexible substrate. The flexible substrate includes a flexible printed circuit board having at least one light emitting diode mounted thereon. The at least one light emitting diode includes an emitting portion configured to emit light. The light emitting diode device also includes an encapsulation structure disposed over the flexible printed circuit board having a reflective side and a light emission side opposite of the reflective side. The light emitting diode also includes a reflective portion disposed over the reflective side of the encapsulation structure. The emitting portion of the light emitting diode is oriented along an axis parallel to a plane defined by a top surface of the flexible printed circuit board, and the axis is perpendicular to a plane defined by a top surface of the reflective side In other features, the reflective portion comprises a reflective structure integral with the encapsulation structure. In other features, the encapsulation structure and the reflective structure include a polymer material. In other features, the reflective structure comprises a maximum thickness of one-half (0.5) of a millimeter. In other features, the polymer material includes a hardness property ranging from forty (40) Shore durometers to seventy-five (75) Shore durometers. In other features, the polymer material includes a coefficient of thermal expansion (CTE) ranging from one hundred and seventy (170) in/in C.° to one hundred and eighty (180) in/in C.°.

In other features, the reflective portion includes a reflective material applied to the encapsulation structure. In other features, the reflective material comprises at least one of a white reflective film and a white reflective paint. In other features, the reflective material comprises a thickness ranging from one-tenth (0.1) of a millimeter to one-half (0.5) of a millimeter. In other features, the encapsulation structure is configured to diffuse between fifty percent (50%) to ninety (90%) of the light emitted by the light emitting diode.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

The present disclosure is directed to a side-emitting LED lighting strip. The side-emitting LED lighting strip includes a substrate that employs side-emitting LEDs that include an emitting portion that is oriented opposite to a transmission surface of the encapsulation structure. Thus, observers are not directly exposed to light emitted by the emitting portion of the LEDs. The substrate can also include an encapsulation structure having diffusion properties to diffuse light emitted by one or more LEDs. The diffused light can provide uniform illuminance, which may be aesthetically pleasing to observers. The diffusion properties can also disperse heat generated by the light in contrast with encapsulation structures having minimal diffusion properties.

Figure 1A:
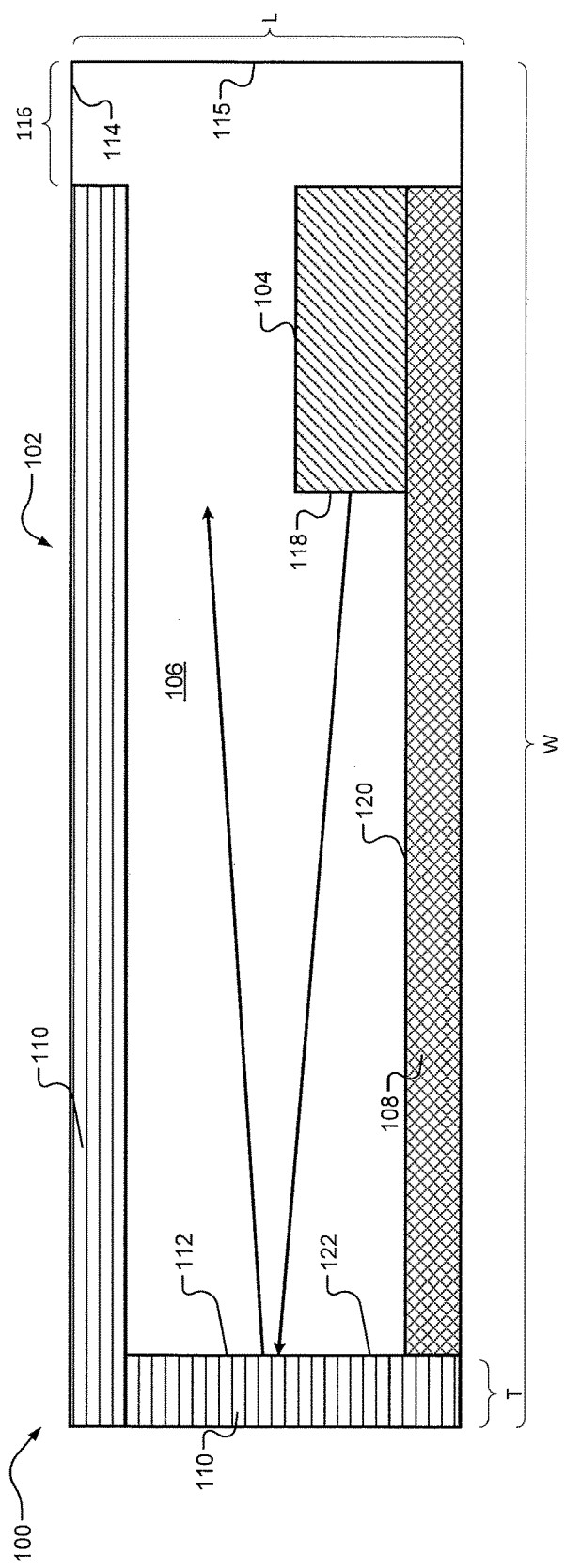
FIG. 1A is a cross-sectional view of a side-emitting LED lighting strip in accordance with an example implementation of the present disclosure.
Figure 1B:
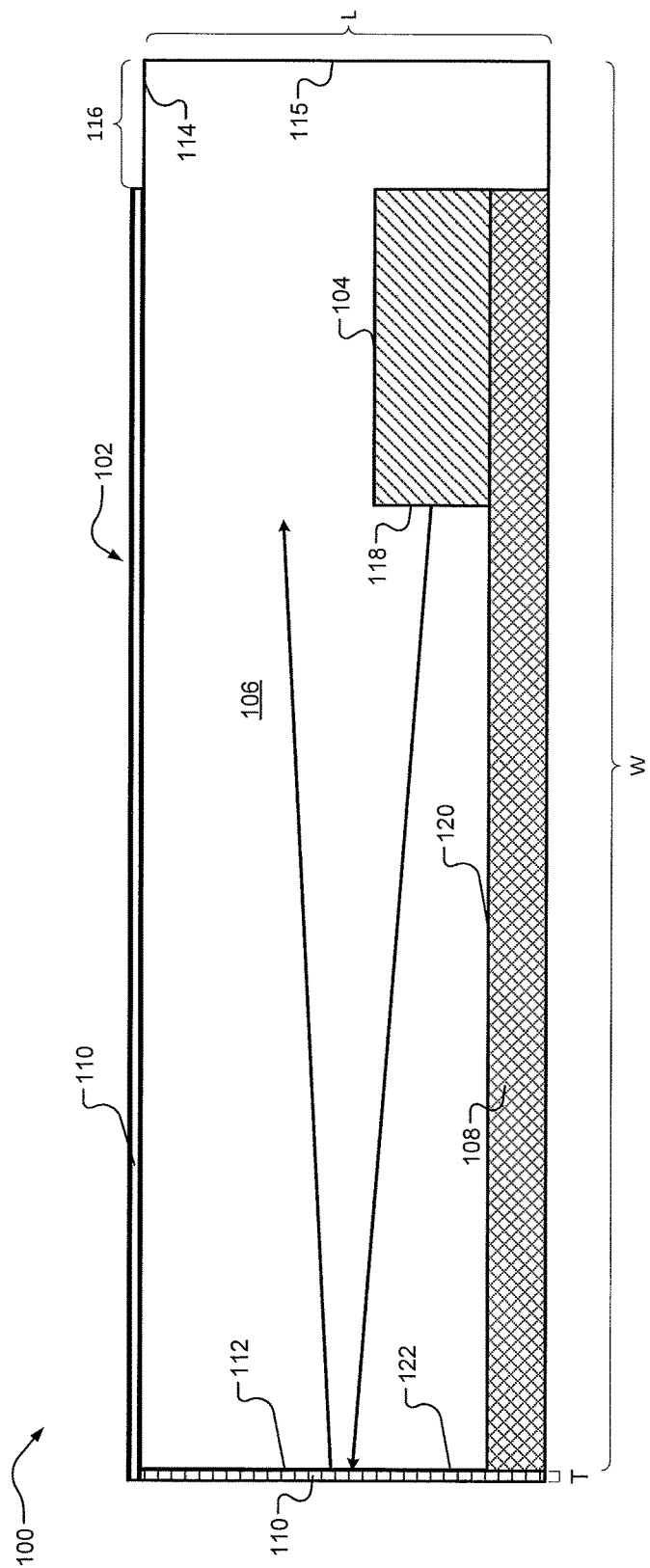
FIG. 1B is a cross-sectional view of a side-emitting LED lighting strip in accordance with another example implementation of the present disclosure.

FIGS. 1A and 1B illustrate an example side-emitting LED lighting strip 100 in accordance with an example implementation of the present disclosure. The side-emitting LED lighting strip 100 includes a flexible substrate 102 having one or more LEDs 104. The flexible substrate 102 includes an encapsulation structure 106 and a flexible printed circuit board 108. For example, the flexible structure 102 includes an elongated encapsulation structure 106 that is attached to an elongated flexible printed circuit board 108 to form an LED strip. The encapsulation structure 106 is disposed over the LEDs 104 and the flexible printed circuit board 108. The LEDs 104 are mounted and connected to the flexible printed circuit board 108. For example, the flexible printed circuit board 108 includes a plurality of conductive pads, or terminations, that interface with corresponding LEDs 104.

The LEDs 104 emit light, which can include visible, ultraviolet, or infrared. The LEDs 104 can be formed from a combination of one or more Group III elements and of one or more Group V elements (III-V semiconductor). Examples of suitable III-V semiconductor materials include nitrides, such as gallium nitride, and phosphides, such as indium gallium phosphide. Other types of III-V materials can be used as well.

In some implementations, the encapsulation structure 106 includes an optically transmissive polymer material that encapsulates the LEDs 104. The polymer material can include suitable polyurethane, polyurethane compounds, and the like. In various implementations, the polymer material includes a hardness property ranging from about forty (40) Shore durometers to about seventy-five (75) Shore durometers (Shore D). The flexible printed circuit board 108 may also have a hardness property similar to the polymer material to allow the flexible printed board 108 to bend with the polymer material. The polymer material may also include a coefficient of thermal expansion (CTE) ranging from about one hundred and seventy (170) in/in C.° to about one hundred and eighty (180) in/in C.°. In some implementations, the flexible substrate 102 may include a width (W) of about five (5) millimeters and a length (L) of three (3) millimeters.

The encapsulation structure 106 includes translucent properties that diffuse light emitted by the LEDs 104. For example, the encapsulation structure 106 diffuses between about fifty percent (50%) to about ninety (90%) of the light emitted by the LEDs 104. In one or more implementations, the diffusion properties assist in distributing heat throughout the encapsulation structure 106 based on the diffused light within the encapsulation structure 106.

The flexible substrate 102 also includes a reflective portion 110. The reflective portion 110 reflects light emitted by the LEDs 104. For example, the reflective portion 110 may have an average reflectivity for visible light emitted by the LEDs 104 above ninety percent (90%). The average reflectivity of the reflective portion 110 may be at least ninety percent (90%), ninety-five percent (95%), ninety-eight percent (98%), ninety-nine percent (99%), or more. In an implementation, as shown in FIG. 1A, the reflective portion 110 includes a reflective structure. In another implementation, as shown in FIG. 1B, the reflective portion 110 includes a reflective layer. As described in greater detail herein, the reflective portion 110 includes any suitable reflective material to reflect light emitted by the LEDs 104. For example, the reflective portion 110 includes a reflective metal such as aluminum or the like, a reflective film, a reflective paint, or the like. The reflective portion 110 may include a white reflective material to reflect light occurring in the visible light spectrum.

In some implementations, the reflective portion 110 extends completely over a reflective side 112 of the encapsulation structure 106 and partially over a top side 114 of the encapsulation structure 106. Light reflected by the reflective portion 110 is diffused within the encapsulation structure 106 and exits the encapsulation structure 106 via a light emission side 115 of the encapsulation structure 106 and/or the uncovered portion 116 of the top side 114. In various implementations, the reflective portion 110 covers at least fifty percent (50%) to at least ninety percent (90%) of the top side 114. Thus, the uncovered portion 116 of the top side 114 may include at least ten percent (10%) to at least fifty percent (50%) of the top side 114.

The LEDs 104 are oriented to emit light towards the reflective portion 110. For example, the LED 104 includes an emitting portion 118 that is oriented along an axis parallel to a plane defined by a top surface 120 of the flexible printed circuit board 108. The plane defined by the top surface 120 is perpendicular to a plane defined by a top surface 122 of the reflective side 112. The emitting portion 118 is also oriented opposite to the light emission side 115. The light emitted by the LEDs 104 is reflected by the reflective portion 110 before exiting the encapsulation structure 106.

Referring to FIG. 1A, the encapsulation structure 106 includes the reflective portion 110. In this implementation, the reflective portion 110 includes a reflective structure that is integral with the encapsulation structure 106. In this example, the encapsulation structure 106 and the reflective portion 110 include the same polymer material to maintain a consistent thermal expansion rate. In this implementation, the reflective portion 110 includes a maximum thickness (T) of one-half (0.5) of a millimeter.

Referring to FIG. 1B, the encapsulation structure 106 and the reflective portion 110 form discrete portions of the device 102. For example, the encapsulation structure 106 includes the polyurethane material and the reflective portion 110 includes a reflective material, such as a reflective film or a reflective paint, applied to the encapsulation structure 106. In this implementation, the reflective portion 110 includes a thickness ranging from one-tenth (0.1) of a millimeter to one-half (0.5) of a millimeter.

Figure 2:
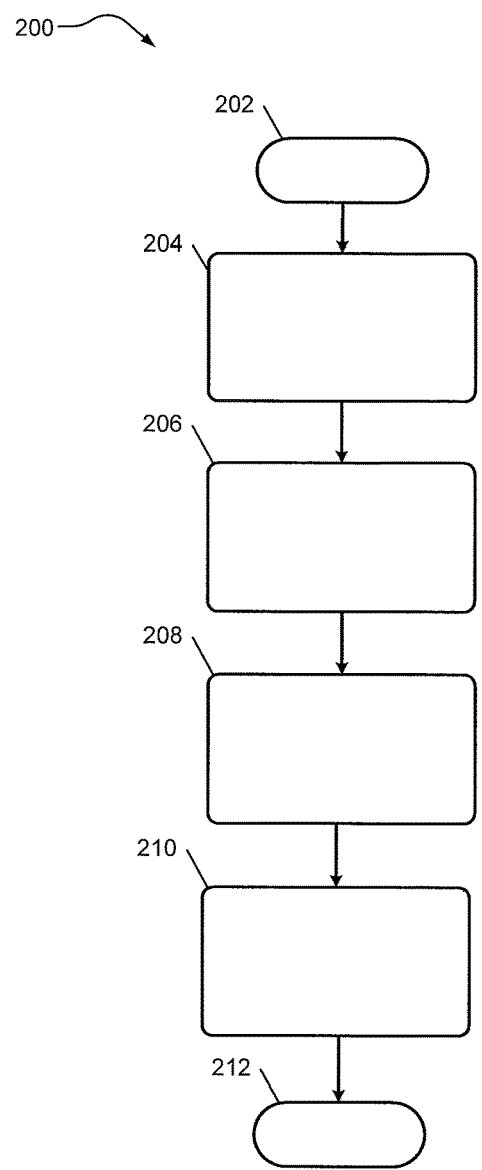
FIG. 2 is a flow diagram illustrating an example method for fabricating the side-emitting LED lighting strip show in FIG. 1A.
Figure 3:
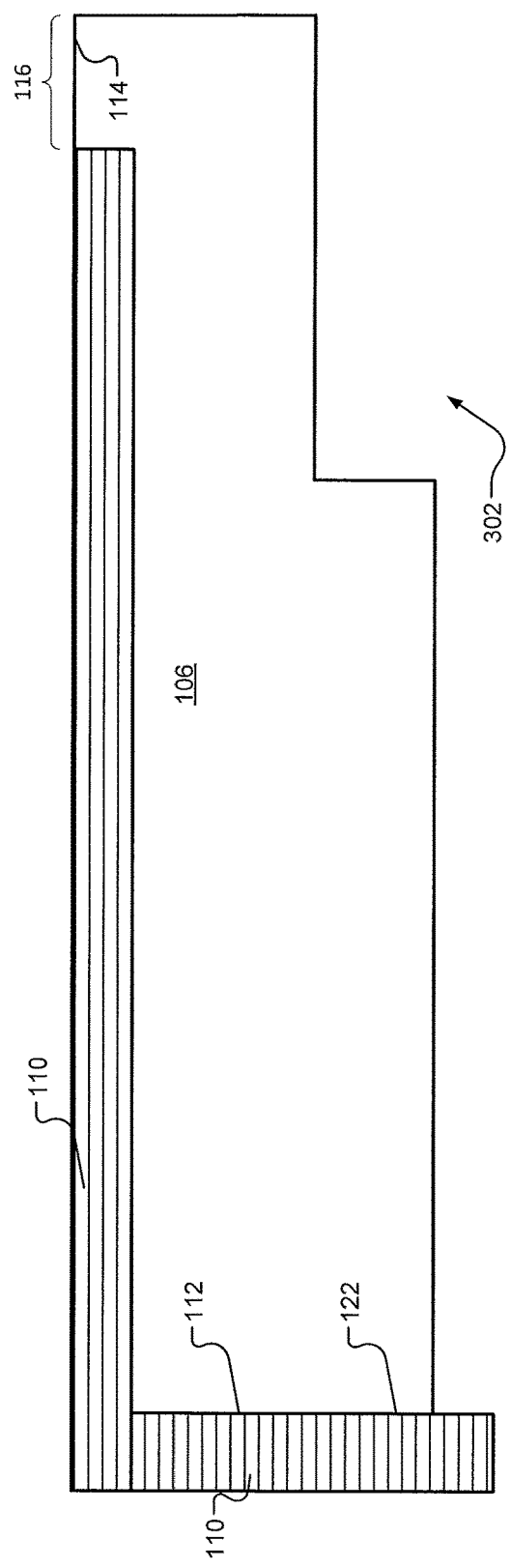
FIGS. 3 through 6 illustrate example cross-sectional views of the side-emitting LED lighting strip in accordance with the fabrication process shown in FIG. 2.

FIG. 2 illustrates an example method 200 for forming the side-emitting LED lighting strip 100 in accordance with the implementation shown in FIG. 1A. The method 200 starts at 202. At 204, the encapsulation structure 106 and the reflective structure are formed through a suitable extrusion process. For example, as shown in FIG. 3, the encapsulation structure 106 and the reflective structure are constructed through the extrusion process, such as an additive manufacturing process, or the like. In one example, the extrusion process is a two-color extrusion process that integrally forms the encapsulation structure 106 and the reflective structure. The encapsulation structure 106 can be formed to include a flexible printed circuit board receiving portion 302.

Figure 4:
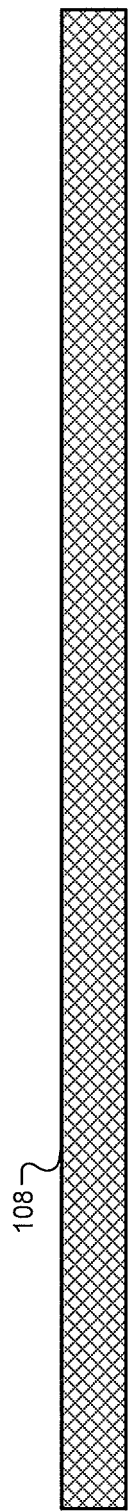
Figure 5:
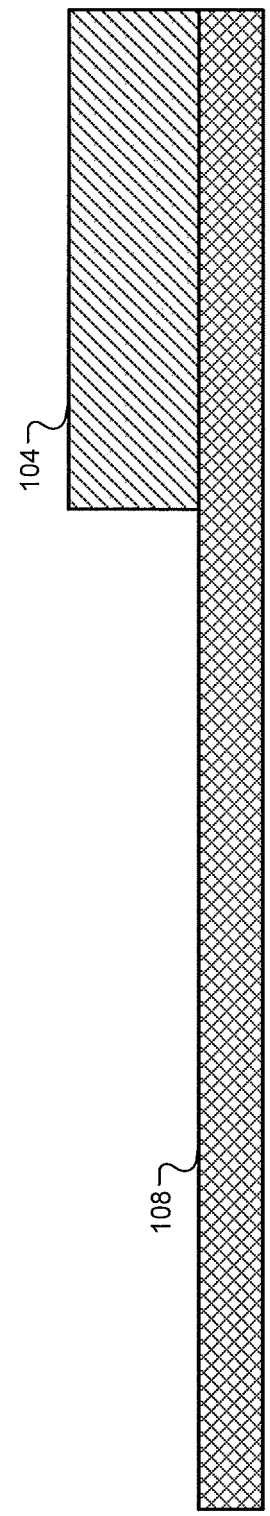
Figure 6:
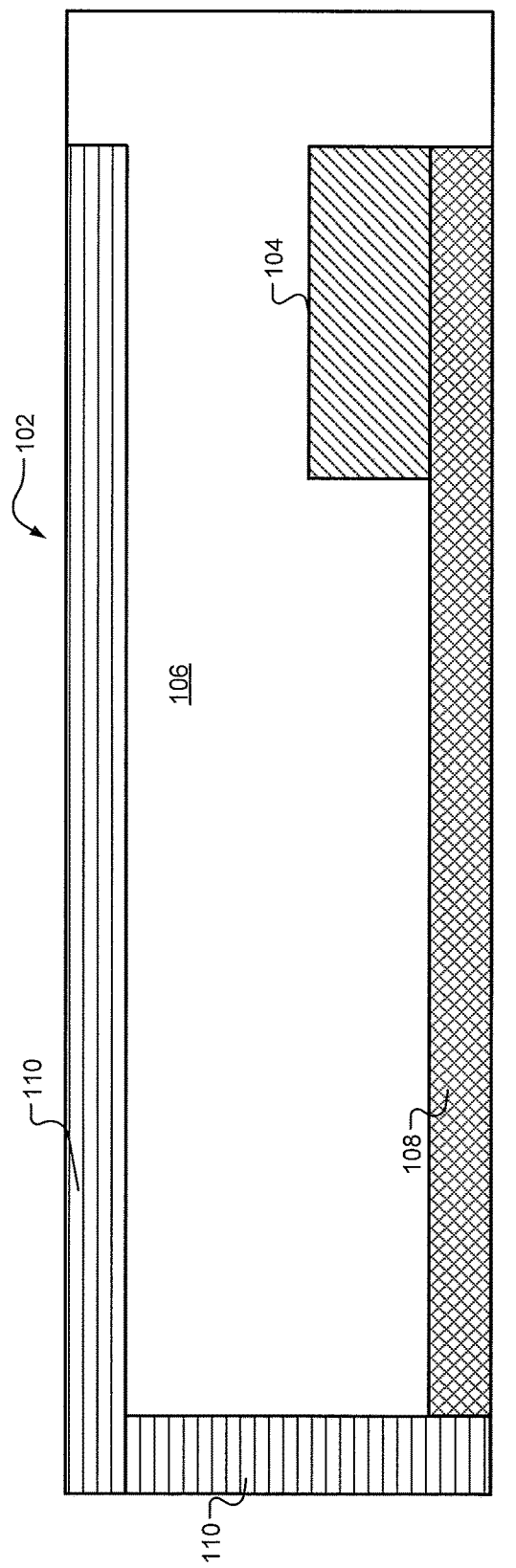

At 206, the flexible printed circuit board 108 is fabricated, as shown in FIG. 4. In one example, the flexible printed circuit board 108 is fabricated through a substrate fabrication process. In another example, the flexible printed circuit board is fabricated through an additive fabrication process. At 208, the LEDs 104 are attached to the flexible printed circuit board 108, as shown in FIG. 5. At 210, the flexible printed circuit board 108 is received by the flexible printed circuit board receiving portion 302 and is attached to the encapsulation structure 106. The flexible printed circuit board 108 is attached to the encapsulation structure 106 through one or more suitable attachment processes as shown in FIG. 6. For example, the flexible printed circuit board 108 can be attached to the encapsulation structure 106 with an adhesive, such as an optically transmissive adhesive. At 212, the method 200 ends.

Figure 7:
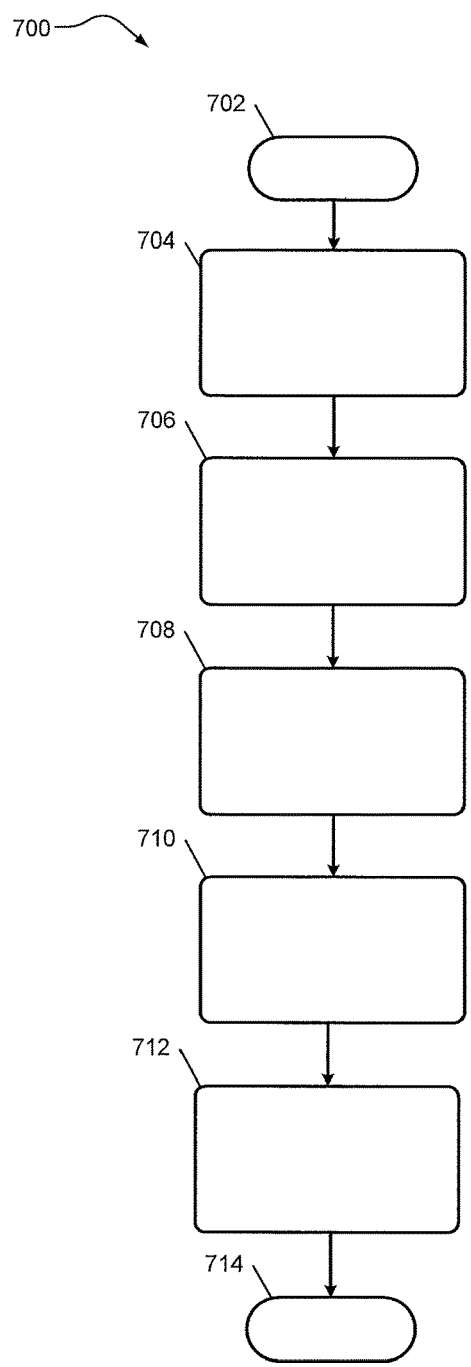
FIG. 7 is a flow diagram illustrating an example method for fabricating the side-emitting LED lighting strip show in FIG. 1B.
Figure 8:
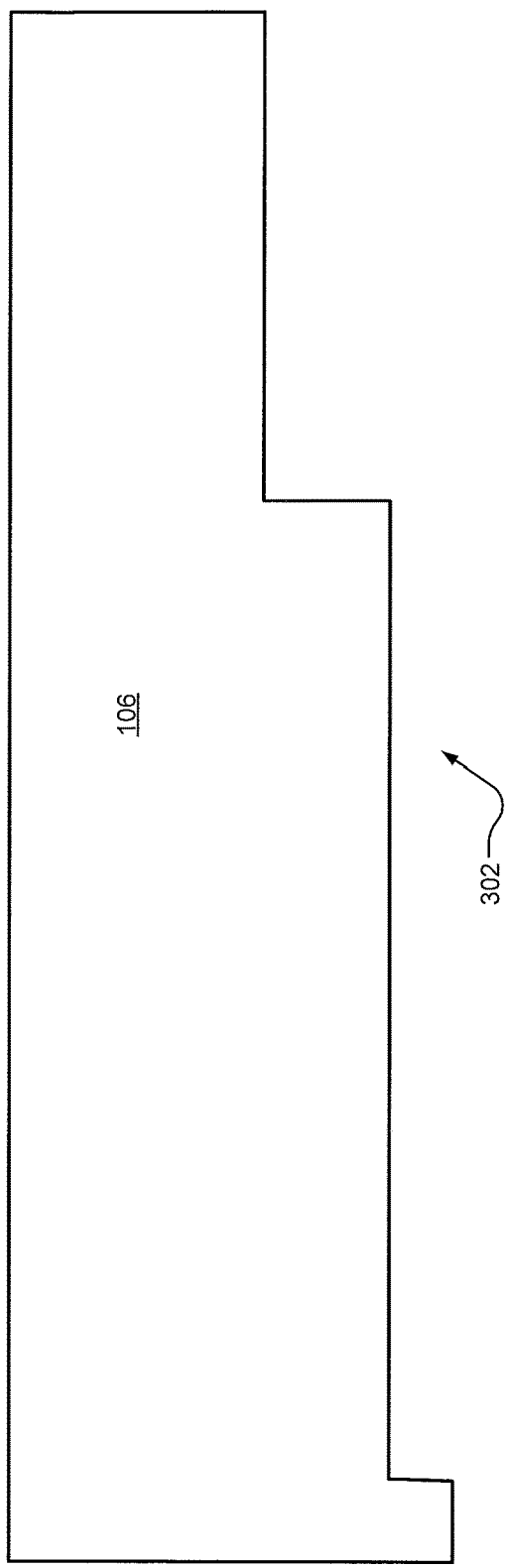
FIGS. 8 through 12 illustrate example cross-sectional views of the side-emitting LED lighting strip in accordance with the fabrication process shown in FIG. 7.
Figure 9:
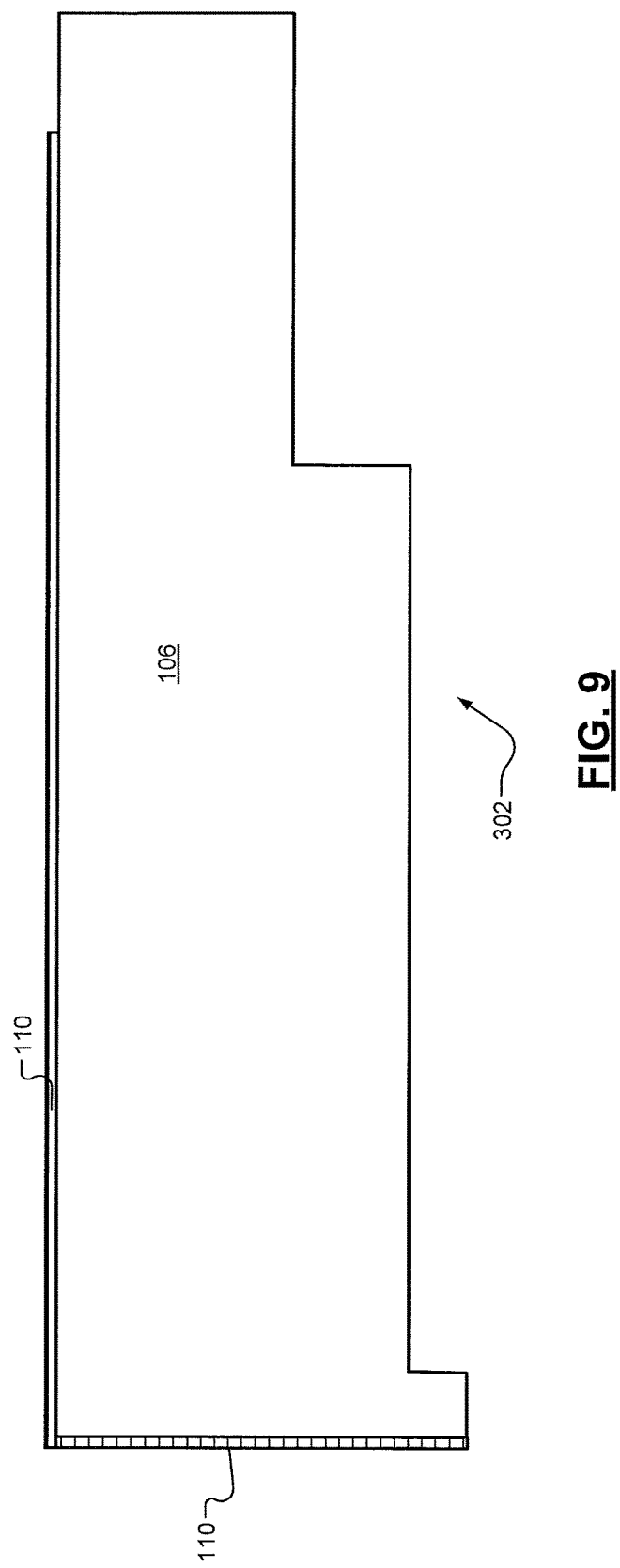

FIG. 7 illustrates an example method 700 for forming the side-emitting LED lighting strip 100 in accordance with the implementation shown in FIG. 1B. The method 700 starts at 702. At 704, the encapsulation structure 106 is formed through a suitable extrusion process as shown in FIG. 8. At 706, the reflective layer is applied to the encapsulation structure 106 (see FIG. 9). For example, a white reflective film is applied to the encapsulation structure 106. In another example, a white reflective paint is applied to the encapsulation structure 106.

Figure 10:
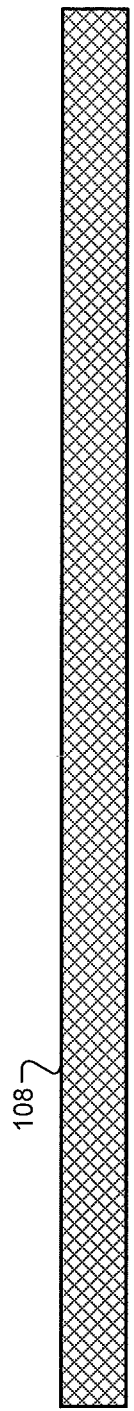
Figure 11:
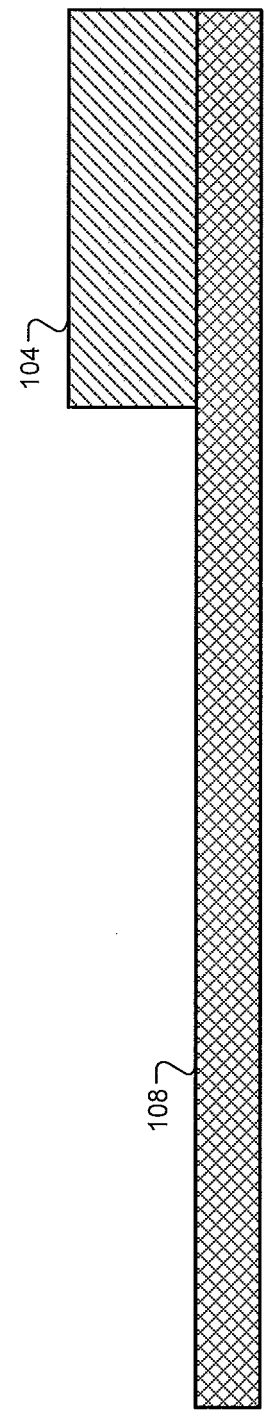
Figure 12:
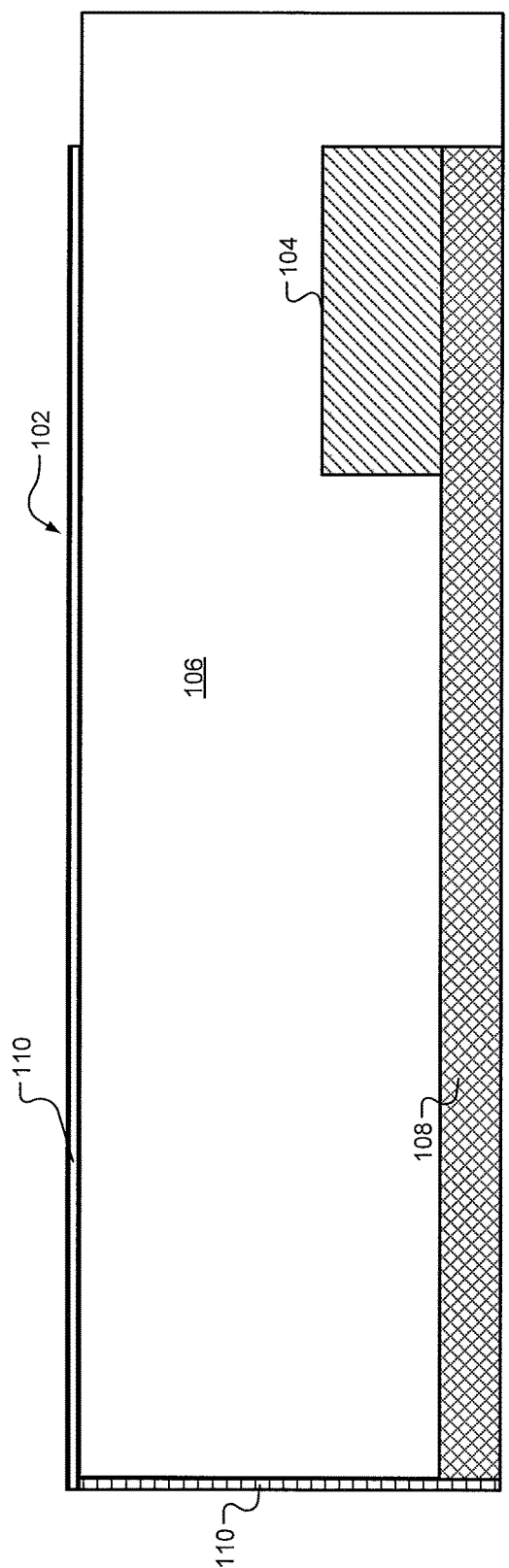

At 708, the flexible printed circuit board 108 is fabricated, as shown in FIG. 10. At 710, the LEDs 104 are attached to the flexible printed circuit board 108, as shown in FIG. 11. At 712, the flexible printed circuit board 108 is attached to the encapsulation structure 106 as shown in FIG. 12. In one example, the flexible printed circuit board 108 is attached to the encapsulation structure 106 using the suitable adhesive. In another example, the flexible printed circuit board 108 is attached to the encapsulation structure 106 using a suitable co-extrusion process. In yet another example, the flexible printed circuit board 108 is attached to the encapsulation structure 106 using a suitable glue jetting process. At 714, the method 700 ends.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

None of the elements recited in the claims are intended to be a means-plus-function element within the meaning of 35 U.S.C. § 112(f) unless an element is expressly recited using the phrase "means for," or in the case of a method claim using the phrases "operation for" or "step for."

What is claimed is:

1. A light emitting diode device comprising:
a flexible substrate comprising:
- a flexible printed circuit board having at least one light emitting diode mounted thereon, the at least one light emitting diode including an emitting portion configured to emit light;
- an encapsulation structure disposed over the flexible printed circuit board having a reflective side and a light emission side opposite of the reflective side; and
- a reflective portion disposed over the reflective side of the encapsulation structure and over a portion of a top side of the encapsulation structure, wherein an uncovered portion is defined along the top side of the encapsulation structure between the reflective side and the reflective portion,
- wherein the emitting portion of the light emitting diode is oriented along an axis parallel to a plane defined by a top surface of the flexible printed circuit board and is oriented to emit light only towards the reflective side, wherein the axis is perpendicular to a plane defined by a top surface of the reflective side.

2. The light emitting diode device as recited in claim 1, wherein the reflective portion comprises a reflective structure integral with the encapsulation structure.

3. The light emitting diode device as recited in claim 2, wherein the encapsulation structure and the reflective structure include a polymer material.

4. The light emitting diode device as recited in claim 2, wherein the reflective structure comprises a maximum thickness of one-half (0.5) of a millimeter.

5. The light emitting diode device as recited in claim 3, wherein the polymer material includes a hardness property ranging from forty (40) Shore durometers to seventy-five (75) Shore durometers.

6. The light emitting diode device as recited in claim 3, wherein the polymer material includes a coefficient of thermal expansion (CTE) ranging from one hundred and seventy (170) in/in C.° to one hundred and eighty (180) in/in C.°.

7. The light emitting diode device as recited in claim 1, wherein the reflective portion comprises a reflective material applied to the encapsulation structure.

8. The light emitting diode device as recited in claim 7, wherein the reflective material comprises at least one of a white reflective film and a white reflective paint.

9. The light emitting diode device as recited in claim 7, wherein the reflective material comprises a thickness ranging from one-tenth (0.1) of a millimeter to one-half (0.5) of a millimeter.

10. The light emitting diode device as recited in claim 1, wherein the encapsulation structure is configured to diffuse between fifty percent (50%) to ninety (90%) of the light emitted by the light emitting diode.

* * * * *